(12) United States Patent
Kim et al.

(10) Patent No.: US 11,758,657 B2
(45) Date of Patent: Sep. 12, 2023

(54) PRINTED CIRCUIT BOARD

(71) Applicant: SAMSUNG ELECTRO-MECHANICS CO., LTD., Suwon-si (KR)

(72) Inventors: Eun Sun Kim, Suwon-si (KR); Jin Uk Lee, Suwon-si (KR); Young Hun You, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/475,747

(22) Filed: Sep. 15, 2021

(65) Prior Publication Data
US 2022/0322528 A1    Oct. 6, 2022

(30) Foreign Application Priority Data
Mar. 31, 2021    (KR) .................. 10-2021-0041953

(51) Int. Cl.
| | |
|---|---|
| *H05K 1/11* | (2006.01) |
| *H05K 1/18* | (2006.01) |
| *H05K 1/02* | (2006.01) |
| *H05K 1/09* | (2006.01) |

(52) U.S. Cl.
CPC ........... *H05K 1/115* (2013.01); *H05K 1/0298* (2013.01); *H05K 1/09* (2013.01); *H05K 1/111* (2013.01); *H05K 1/18* (2013.01); *H05K 1/185* (2013.01)

(58) Field of Classification Search
CPC ........ H05K 1/115; H05K 1/0298; H05K 1/09; H05K 1/18; H05K 1/185; H05K 1/111; H05K 3/4697
See application file for complete search history.

(56) References Cited

U.S. PATENT DOCUMENTS

| | | | |
|---|---|---|---|
| 6,393,696 B1 * | 5/2002 | Yoon .................. | H01L 23/49833 428/137 |
| 2017/0055349 A1 * | 2/2017 | Chang .................. | H05K 3/4697 |
| 2017/0243841 A1 * | 8/2017 | Ko ........................ | H05K 3/0073 |
| 2019/0104615 A1 * | 4/2019 | Furutani ................ | H05K 1/186 |
| 2019/0288398 A1 * | 9/2019 | Taniguchi ............. | H05K 3/0032 |

FOREIGN PATENT DOCUMENTS

| | | |
|---|---|---|
| JP | 6778667 B2 | 11/2020 |
| KR | 10-0298897 B1 | 9/2001 |

* cited by examiner

*Primary Examiner* — Ishwarbhai B Patel
(74) *Attorney, Agent, or Firm* — Morgan, Lewis & Bockius LLP

(57) ABSTRACT

A printed circuit board includes a first insulating layer; a first wiring layer disposed on one surface of the first insulating layer and including a pad; a second insulating layer disposed on the one surface of the first insulating layer and covering the first wiring layer; a second wiring layer disposed on one surface of the second insulating layer and including a metal pattern; a third insulating layer disposed on the one surface of the second insulating layer and covering the second wiring layer; and a cavity extending through each of the second and third insulating layers, and having a bottom surface and a sidewall respectively exposing the pad of the first wiring layer and the metal pattern of the second wiring layer. The cavity includes a non-through groove in the one surface of the first insulating layer.

21 Claims, 8 Drawing Sheets

PRINTED CIRCUIT BOARD

CROSS-REFERENCE TO RELATED APPLICATION(S)

This application claims benefit of priority to Korean Patent Application No. 10-2021-0041953 filed on Mar. 31, 2021 in the Korean Intellectual Property Office, the disclosure of which is incorporated herein by reference in its entirety.

TECHNICAL FIELD

The present disclosure relates to a printed circuit board.

BACKGROUND

In order to respond to the recent trend for lightness, miniaturization, and the like, of mobile devices, the need to implement lightness, thinning, shortening, and miniaturization in printed circuit boards mounted thereon is also gradually increasing.

Meanwhile, as mobile devices are becoming lighter, thinner, shorter, and smaller, in response to technical demands, a technology in which electronic components such as ICs, active devices, passive devices, or the like are inserted into aboard is required in terms of shortening a connection path between the electronic components and improving noise-related problems. In recent years, research into a technology for embedding components in a board using various methods has continued.

In particular, a board including a cavity is formed in order to insert various components into the board.

SUMMARY

An aspect of the present disclosure is to provide a printed circuit board including a microcircuit and/or a micro via.

Another aspect of the present disclosure is to provide a printed circuit board having improved uniformity of a microcircuit.

Another aspect of the present disclosure is to provide a printed circuit board having improved positional accuracy and cavity size during processing of the cavity.

According to an aspect of the present disclosure, a printed circuit board includes a first insulating layer; a first wiring layer disposed on one surface of the first insulating layer and including a pad; a second insulating layer disposed on the one surface of the first insulating layer and covering the first wiring layer; a second wiring layer disposed on one surface of the second insulating layer and including a metal pattern; a third insulating layer disposed on the one surface of the second insulating layer and covering the second wiring layer; and a cavity extending through each of the second and third insulating layers, and having a bottom surface and a sidewall respectively exposing the pad of the first wiring layer and the metal pattern of the second wiring layer. The cavity includes a non-through groove in the one surface of the first insulating layer.

According to an aspect of the present disclosure, a printed circuit board includes a plurality of insulating layers; a second wiring layer including a metal pattern having a portion disposed between two of the plurality of insulating layers; a cavity extending through at least the two of the plurality of insulating layers; and a first wiring layer disposed in a first insulating layer of the plurality of insulating layers, and including a pad disposed in the cavity. One surface of the metal pattern provides as a portion of a sidewall of the cavity, and the cavity extends into a portion of first insulating layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
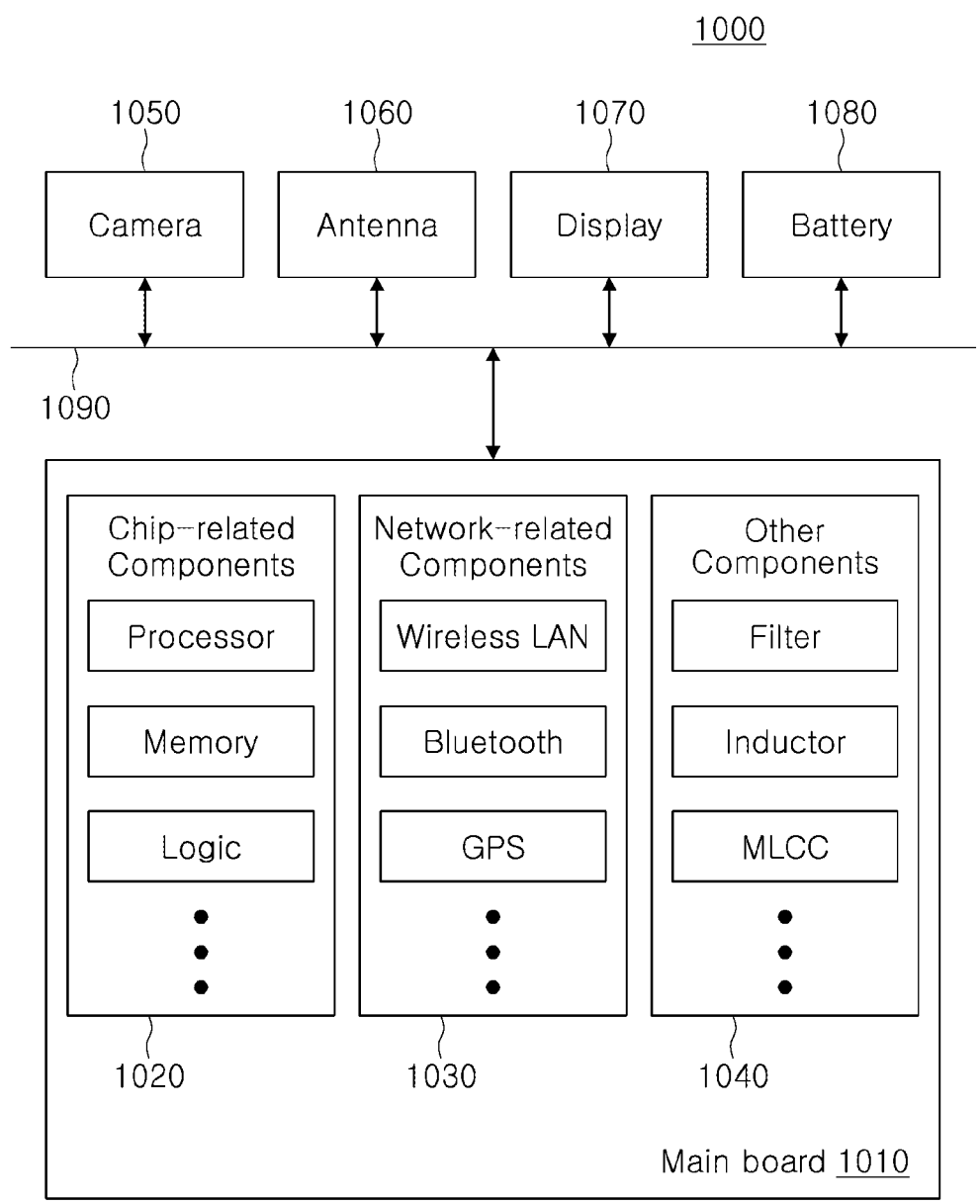
FIG. 1 is a view schematically illustrating an example of an electronic device system.

Hereinafter, the present disclosure will be described with reference to the accompanying drawings. Shapes, sizes, and the like of the elements in the drawings may be exaggerated or reduced for more clear description.

In addition, in assigning reference numbers to elements of the accompanying drawings, like reference numerals will denote like elements as possible, even though they are indicated in different drawings.

Moreover, in describing the present disclosure, if it is determined that the detailed description of the related well-known technology may unnecessarily obscure the gist of the present disclosure, the detailed description thereof will be omitted.

Electronic Device

FIG. 1 is a block diagram schematically illustrating an example of an electronic device system.

Referring to the drawing, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, but may also include other types of chip related components. In addition, the chip related components 1020 may be combined with each other. The chip related component 1020 may be in the form of a package including the above-described chip or an electronic component.

The network related components 1030 may include components compatible with or communicating using various protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with or communicating using a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
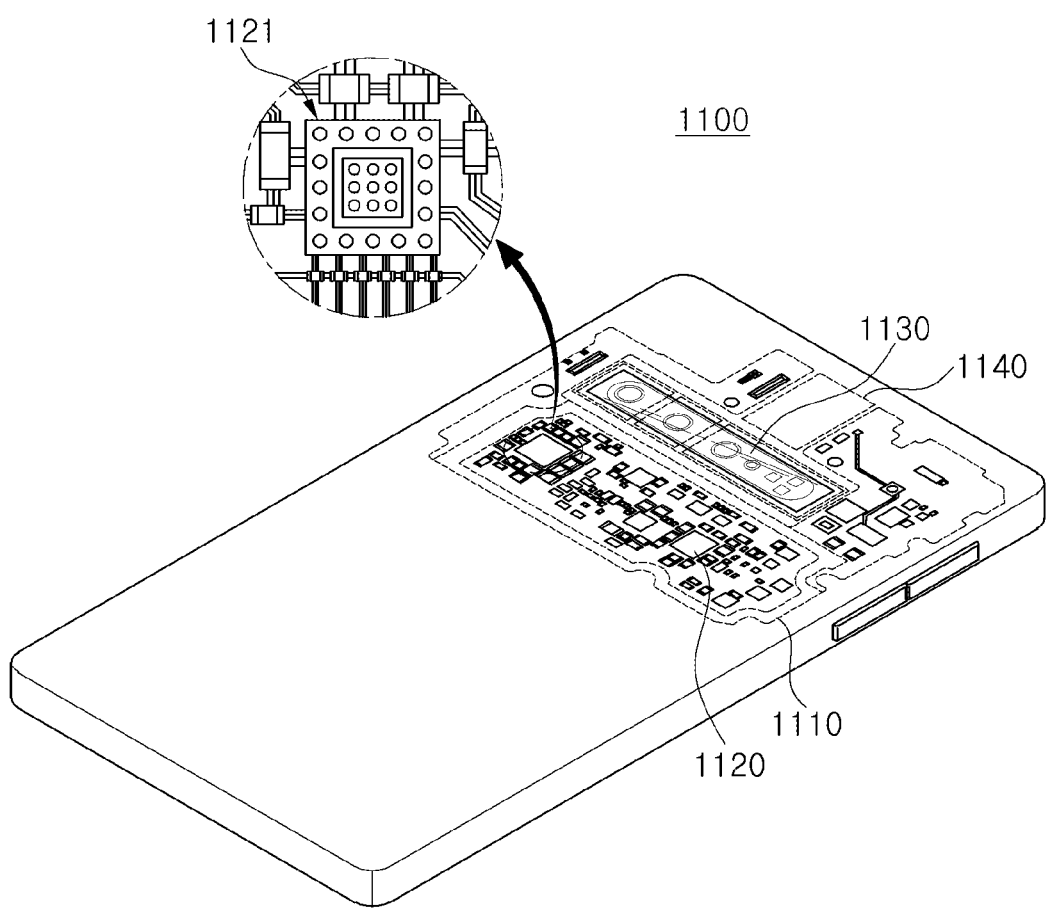
FIG. 2 is a view schematically illustrating an example of an electronic device.

FIG. 2 is a perspective view schematically illustrating an example of an electronic device.

Referring to the drawing, an electronic device may be, for example, a smartphone 1100. A main board 1110 may be accommodated in the smartphone 1100, and various electronic components 1120 may be physically and/or electrically connected to the main board 1110. In addition, other electronic components, such as a camera module 1130 and/or a speaker 1140, which may or may not be physically and/or electrically connected to the main board 1110 may be accommodated therein. A portion of the electronic components 1120 may be the above-described chip related components, for example, an antenna module 1121, but are not limited thereto. The antenna module 1121 may be provided as a surface-mounted form in which a semiconductor chip or a passive component is mounted on a printed circuit board, but is not limited thereto. The electronic device is not necessarily limited to the smartphone 1100, but may be other electronic devices as described above.

Structure and Manufacturing Method of Printed Circuit Board

Figure 3:
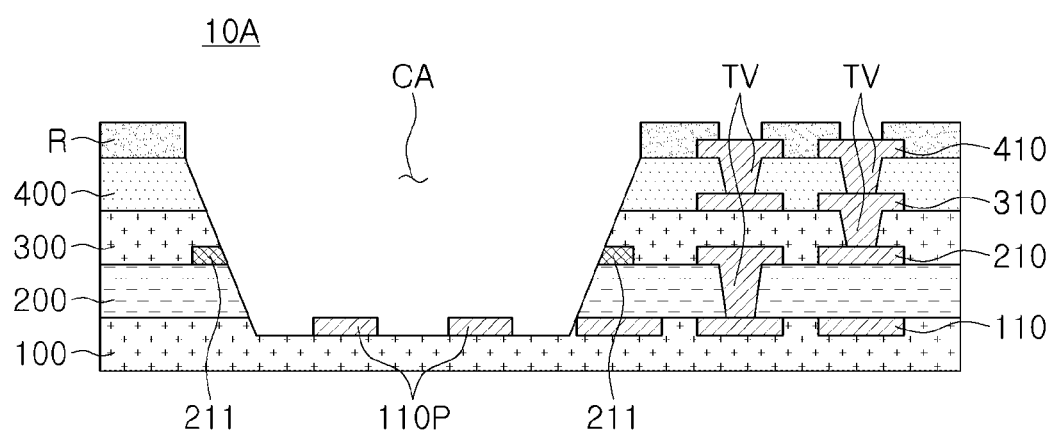
FIG. 3 is a view schematically illustrating an example of a printed circuit board according to the present disclosure.

FIG. 3 is a view schematically illustrating an example of a printed circuit board according to the present disclosure.

Referring to the drawing, a printed circuit board 10A may include a first insulating layer 100; a first wiring layer 110 disposed on one surface of the first insulating layer 100 and including a pad 110P; a second insulating layer 200 disposed on the one surface of the first insulating layer 100 and covering the first wiring layer 110; a second wiring layer 210 disposed on one surface of the second insulating layer 200 and including a metal pattern 211; a third insulating layer 300 disposed on the one surface of the second insulating layer 200 and covering the second wiring layer 200; and a cavity CA extending through each of the second and third insulating layers 200 and 300.

In this case, the first wiring layer 110 may be partially or completely buried in the first insulating layer 100, and an upper surface of the pad 110P of the first wiring layer 110 may be formed to be coplanar with a lower surface of the second insulating layer 200.

In addition, the printed circuit board 10A may further include a third wiring layer 310 disposed on one surface of the third insulating layer 300, a fourth insulating layer 400 disposed on the one surface of the third insulating layer 300 and covering the third wiring layer 310, a fourth wiring layer 410 disposed on one surface of the fourth insulating layer 400, and a via TV connecting the first to fourth wiring layers 110, 210, 310, and 410.

In addition, the printed circuit board 10A may further include a solder resist layer R disposed on one surface of the fourth insulating layer 400 and extending the cavity CA.

Also, an opening may be formed in the solder resist layer R to expose a portion of the fourth wiring layer 410 externally.

The first to fourth insulating layers 100, 200, 300, and 400 may include the same material or different materials. In addition, the first to fourth insulating layers 100, 200, 300, and 400 may include a thermosetting resin.

In addition, a material for forming the first to fourth insulating layers 100, 200, 300, and 400 is not particularly limited. For example, known materials such as prepreg (PPG), Ajinomoto build-up film (ABF), polyimide, epoxy, a copper foil coating resin (RCC), a liquid crystal polymer (LCP), or the like may be used.

The first to fourth wiring layers 110, 210, 310, and 410 may be formed by a plating process. For example, the first to fourth wiring layers 110, 210, 310, and 410 may be formed by an additive process (AP), a semi-additive process (SAP), or a modified semi-additive process (MSAP). As another example, the first to fourth wiring layers 110, 210, 310, and 410 may be formed by a subtractive process such as tenting, or the like, but is not limited thereto.

In addition, a conductive material may be used as a material for forming the first to fourth wiring layers 110, 210, 310, and 410. For example, a conductive material such as copper (Cu), aluminum (Al), silver (Ag), gold (Au), nickel (Ni), lead (Pb), titanium (Ti), tin (Sn), palladium (Pd), alloys thereof, or the like may be used, but is not limited thereto.

In addition, the solder resist layer R may be made of a photosensitive material. In addition, the solder resist layer R may have thermosetting and/or photocuring properties, but is not limited thereto.

In this case, the via TV may have a tapered shape in a direction toward the first wiring layer 110, and the cavity CA may be formed to further extend through the fourth insulating layer 400. For example, the via TV may have a shape that may become narrower in the direction toward the first wiring layer 110.

In addition, the via TV may be completely filled with a metal material, or the metal material may be formed along a wall surface of the via hole. The via TV may be formed by a plating process, for example, AP, SAP, MSAP, TT, or the like. As a result, the via TV may include a seed layer that may be an electroless plating layer and an electrolytic plating layer formed based on the seed layer. As necessary, a primer copper foil may be further included.

The cavity CA may have a bottom surface and a sidewall respectively exposing the pad 110P of the first wiring layer 110 and the metal pattern 211 of the second wiring layer 210.

In addition, the cavity CA may form a non-through groove in one surface of the first insulating layer 100. For example, the cavity CA may extend to one surface of the first insulating layer 100 on which the pad 110P is formed, and the cavity CA may not extend through entirely the first insulating layer 100, but may extend into only a portion of the first insulating layer 100.

The pad 110P of the first wiring layer 110 may be exposed through the cavity CA extending through the first insulating layer 100.

The metal pattern 211 of the second wiring layer 210 may be a mask pattern. The mask pattern may function as a guide pattern, and the metal pattern 211 may be formed to improve positional accuracy and a size thereof in a process of forming the cavity CA. In one example, since the metal pattern 211 functions as a guide pattern to improve positional accuracy and a size thereof in a process of forming the cavity CA, the metal pattern 211 may not be a part of a signal pattern of the printed circuit board 10A, and thus the metal pattern 211 may be spaced apart from (or disconnected from) the signal pattern of the printed circuit board 10A. In one example, the metal pattern 211 may be connected to a ground pattern of the printed circuit board 10A, but the present disclosure is not limited thereto. In another example, the metal pattern 211 may be spaced apart from (or disconnected from) the signal and ground patterns of the printed circuit board 10A.

In addition, the metal pattern 211 of the second wiring layer 210 may include copper (Cu), and may include a metal having lower workability than the first to third insulating layers 100, 200, and 300, but not limited thereto.

In addition, only a single insulating layer may be formed between the metal pattern 211 of the second wiring layer 210 and the pad 110P of the first wiring layer 110.

In this case, the single insulating layer may be the second insulating layer 200, and the first and second wiring layers 110 and 210 may be formed to have patterns protruding from one surface of the second insulating layer 200 and the other surface facing the one surface, respectively.

Also, the cavity CA may respectively expose metal patterns 211 of the second wiring layer 210 through one sidewall and the other sidewall facing the one sidewall in one direction. In this case, lengths of the metal patterns 211 respectively exposed through the one sidewall and the other sidewall of the cavity CA in the one direction may be different or may be the same.

A side surface and one surface of each of the metal patterns 211 may be exposed through the one sidewall and the other sidewall of the cavity CA. In this case, lengths of one surfaces of the metal patterns 211 exposed through the one sidewall and the other sidewall of the cavity CA may be different in the one direction.

In particular, lengths of upper surfaces among exposed surfaces of the metal patterns 211 exposed through the one sidewall and the other sidewall of the cavity CA may be different from each other.

A length of each of the exposed metal patterns 211 in the one direction may correspond to an average value of measured values, and the average value may correspond to an arithmetic average value, but is not limited thereto.

The measured values may correspond to values of the exposed surfaces of the metal patterns 211, measured a plurality of times, in the one direction, but is not limited thereto.

The metal pattern 211 of the second wiring layer 210 may extend to surround the cavity CA, and a shape thereof may be formed in a circle, an ellipse, or a polygon, but is not limited thereto.

In addition, a plurality of metal patterns 211 of the second wiring layer 210 may be formed to surround a side surface of the cavity CA. For example, a board 10 may include four surfaces, and metal patterns 211 of the second wiring layer 210 may be respectively disposed on the four surfaces of the board 10 among the side surfaces of the cavity CA, but are not limited thereto.

In this case, the metal patterns 211 may be exposed through entire sidewalls of the cavity CA, or may be exposed only through one sidewall of the cavity CA. For example, an entire surface of each of the metal patterns 211 surrounding the cavity CA may be exposed by the cavity CA, and only a portion of one surface of each of the metal patterns 211 may be exposed through the cavity CA.

Since other descriptions may be applied in substantially the same manner as those described above, detailed descriptions thereof will be omitted.

Figure 4A:
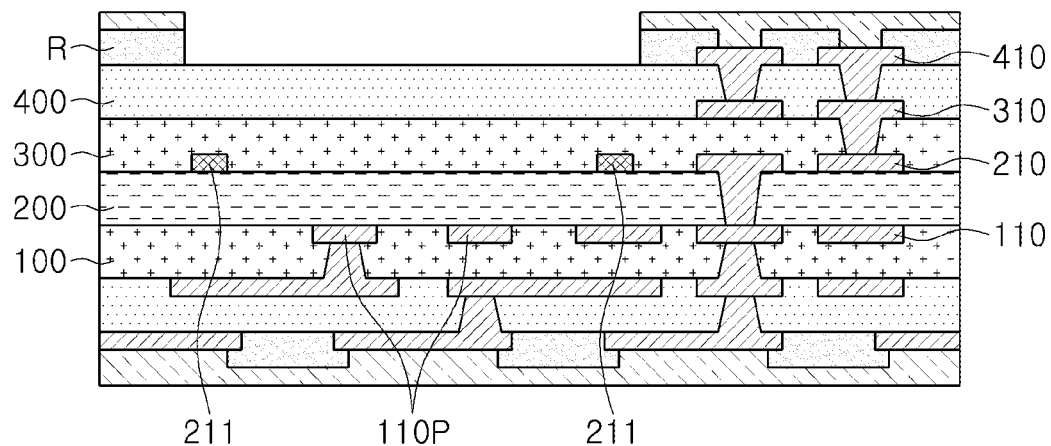
FIGS. 4A to 4C are views schematically illustrating a manufacturing process of a printed circuit board according to the present disclosure.
Figure 4B:
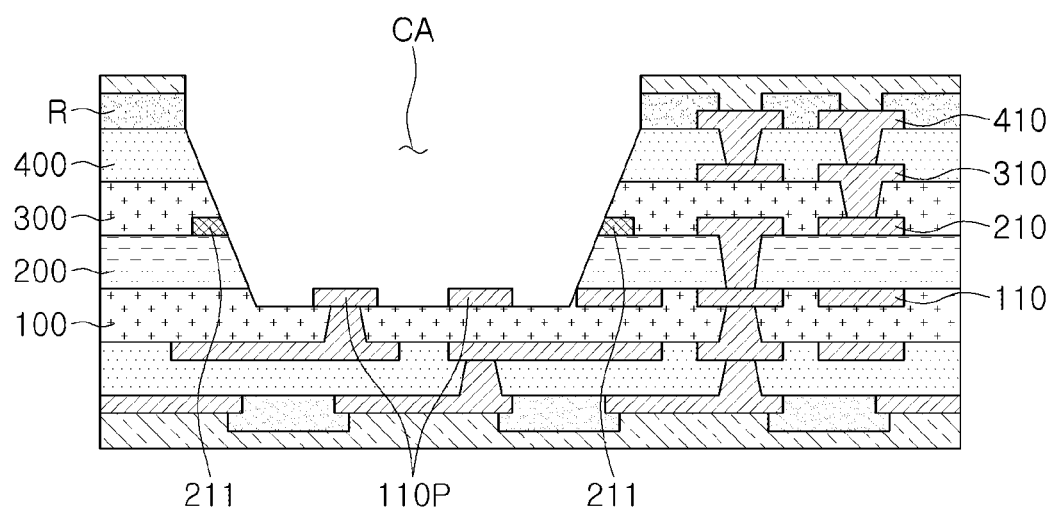
Figure 4C:
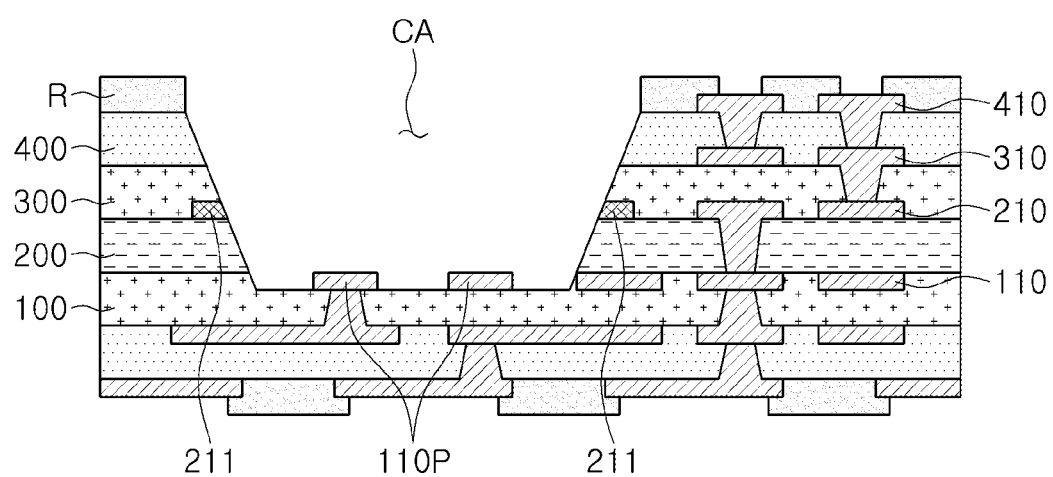

FIGS. 4A to 4C are views schematically illustrating a manufacturing process of a printed circuit board according to the present disclosure.

First, first to fourth insulating layers 100, 200, 300, and 400, first to third wiring layers 110, 210, 310, and 410, and a solder resist layer R may be formed, and a protective layer may be disposed on an outermost side. In this case, a metal pattern 211 may be additionally formed in the second wiring layer 210.

The protective layer may be formed, except for a position in which a cavity CA is formed, and may include a material having lower workability than the first to fourth insulating layers, but is not limited thereto.

Thereafter, a process of forming the cavity CA may be performed. In this case, the cavity CA may be formed by a blasting process, but is not limited thereto.

When the blasting process for forming the cavity CA is performed, the metal pattern 211 may function as a mask pattern or a guide pattern from a point in time in which the metal pattern 211 of the second wiring layer 210 is exposed. Therefore, positional accuracy of forming the cavity CA may be improved, and a size thereof may also be formed with improved accuracy.

In particular, the metal pattern 211 serving as the mask pattern or the guide pattern is formed in a design stage, and may be thus formed by changing a circuit design during a plating process without an additional pattern insertion process.

In addition, since it is unnecessary to secure an additional space for inserting the metal pattern 211, economic efficiency may also be improved.

When the pad 110P of the first wiring layer 110 is exposed by forming the cavity CA, the protective layer on the outermost side may be removed.

Since other descriptions may be applied in substantially the same manner as those described above, detailed descriptions thereof will be omitted.

Figure 5A:
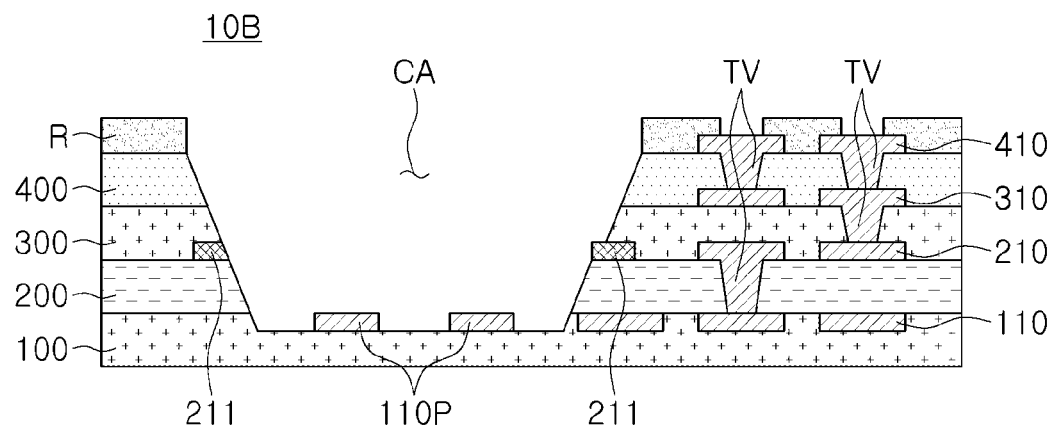
FIGS. 5A and 5B are views schematically illustrating an example of a printed circuit board according to the present disclosure.
Figure 5B:
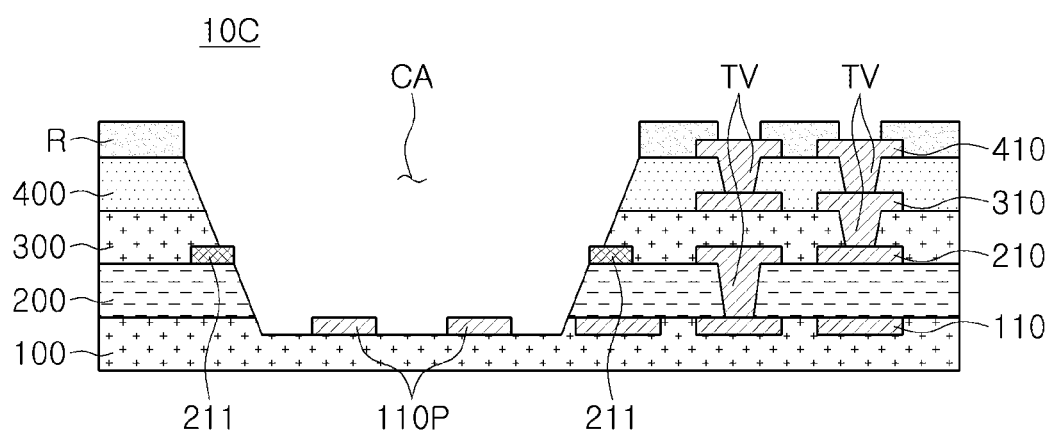

FIGS. 5A and 5B are views schematically illustrating an example of a printed circuit board according to the present disclosure.

Printed circuit boards 10B and 10C on which a cavity CA is formed by the above process may expose a metal pattern 211 of a second wiring layer 210, respectively.

In these cases, the metal pattern 211 may be exposed through one sidewall of the cavity CA and the other sidewall facing the one sidewall in one direction, and a side surface or one surface of the metal pattern 211 may be exposed.

Referring to FIG. 5A, in the printed circuit board 10B, at least one of the one sidewall or the other sidewall of the cavity CA may expose the one surface of the metal pattern 211.

In this case, one side surface of a second insulating layer 200 and one side surface of a third insulating layer 300 may be formed on different straight lines. In one example, the metal pattern 211 may include a portion protruding from a sidewall of the third insulating layer 300.

Referring to FIG. 5B, in the printed circuit board 10C, the one sidewall and the other sidewall of the cavity CA may expose the one surface of the metal pattern 211.

In this case, one side surface and the other side surface of a second insulating layer 200 and one side surface and the other side surface of a third insulating layer 300 may be formed on different straight lines, respectively. In one example, the metal pattern 211 may include a portion protruding from a sidewall of the third insulating layer 300.

Side surfaces and one surfaces of metal patterns 211 respectively exposed through the one sidewall and the other sidewall of the cavity CA may be exposed. In this case, a length of one surface of a metal pattern 211 exposed through the one sidewall of the cavity CA may be different from a length of one surface of a metal pattern 211 exposed through the other sidewall of the cavity CA, in the one direction.

Since other descriptions may be applied in substantially the same manner as those described above, detailed descriptions thereof will be omitted.

Figure 6:
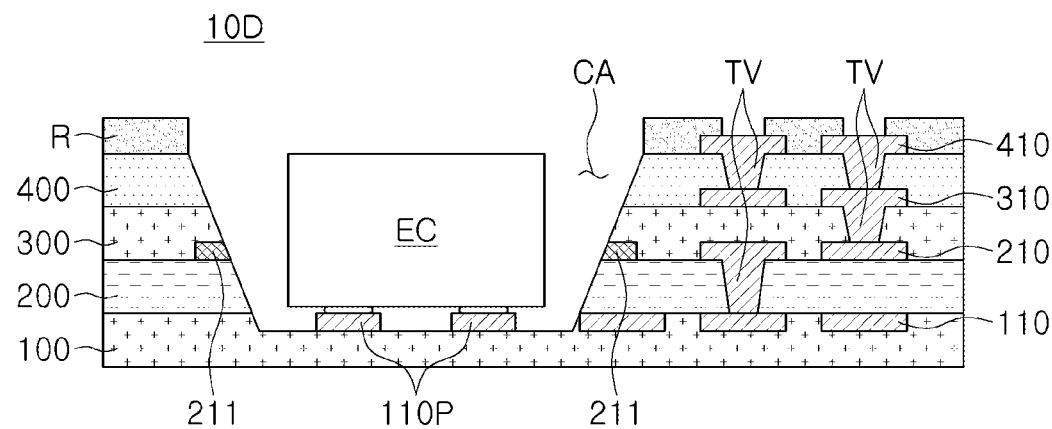
FIG. 6 is a view schematically illustrating an example in which an electronic component is mounted on a printed circuit board according to the present disclosure.

FIG. 6 is a view schematically illustrating an example in which an electronic component is mounted on a printed circuit board according to the present disclosure.

Referring to the drawings, in a printed circuit board 10D, an electronic component EC may be disposed in a cavity CA, and may be connected to an exposed pad 110P of a first wiring layer 110.

The electronic component EC may be connected to the pad 110P through a connection conductor. The connection conductor may be a solder ball, but is not limited thereto, and a conductive material may be used without limitation.

In addition, the electronic component EC may be an active component, specifically, a plurality of dies. The plurality of dies may be connected to each other to implement an application processor. The electronic component EC is not limited thereto, and may be a passive component such as a capacitor, an inductor, or the like.

Since other descriptions may be applied in substantially the same manner as those described above, detailed descriptions thereof will be omitted.

Figure 7:
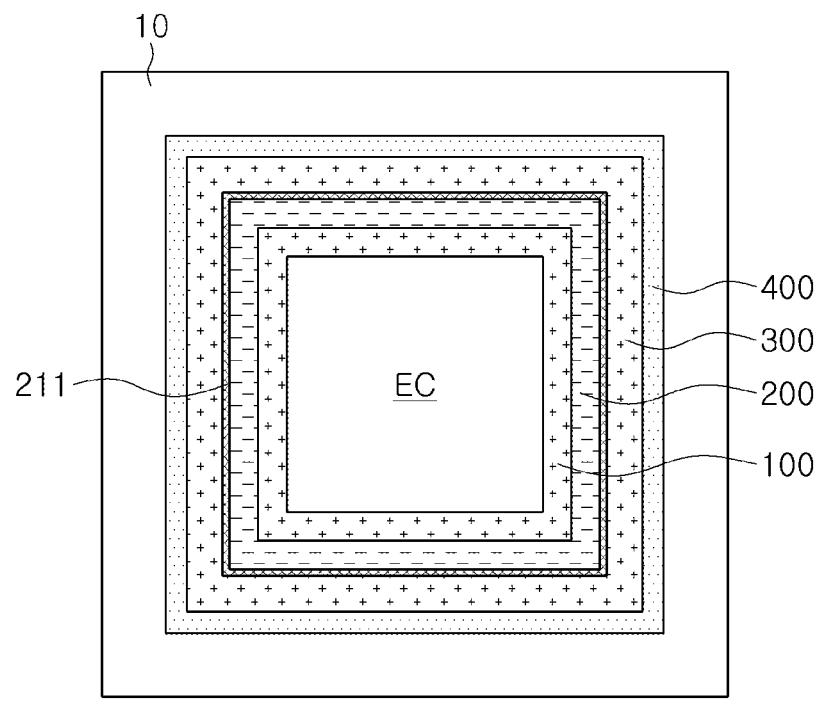
FIG. 7 is a plan view of a printed circuit board according to the present disclosure.

FIG. 7 is a plan view of a printed circuit board according to the present disclosure.

A printed circuit board 10 according to the present disclosure may include a cavity CA, and a metal pattern 211 may be exposed by the cavity CA. Layers on and below the metal pattern 211 may be composed of an insulating layer, and an electronic component EC may be disposed in the cavity CA, to connect a pad 110P exposed through the cavity CA and the electronic component EC.

Referring to the drawing, insulating layers respectively formed on upper and lower surfaces of the metal pattern 211 may be exposed through a sidewall of the cavity CA formed in the printed circuit board 10, and metal patterns 211 embedded in the insulating layers may be exposed.

In this case, the insulating layers respectively formed on the upper and lower surfaces of the metal pattern 211 may include a plurality of insulating layers.

According to the printed circuit board according to an example of the present disclosure, an insulating layer formed on the upper surface of the metal pattern 211 may be third and fourth insulating layers 300 and 400, and an insulating layer formed on the lower surface of the metal pattern 211 may be first and second insulating layers 100 and 200.

The exposed metal pattern 211 may function as a guide pattern or a mask pattern when the cavity CA is formed.

Since the metal pattern 211 may be formed, positional accuracy and a size thereof may be improved in a process of forming the cavity CA.

In particular, the metal pattern 211 serving as the mask pattern or the guide pattern is formed in a design stage, and may be thus formed by changing a circuit design during a plating process without an additional pattern insertion process.

In addition, since it is unnecessary to secure an additional space for inserting the metal pattern 211, economic efficiency may also be improved.

Since other descriptions may be applied in substantially the same manner as those described above, detailed descriptions thereof will be omitted.

Figure 8:
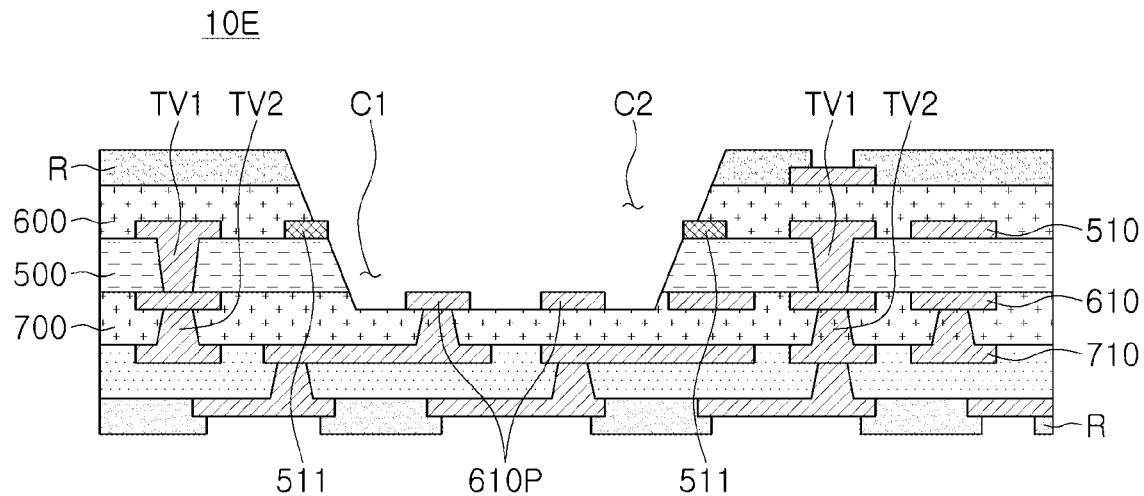
FIG. 8 is a view schematically illustrating a printed circuit board according to another embodiment of the present disclosure.

FIG. 8 is a view schematically illustrating a printed circuit board according to another embodiment of the present disclosure.

Referring to the drawing, a printed circuit board 10E may include a first insulating layer 500 having one surface and the other surface opposing the one surface, and including a first opening C1; a first wiring layer 510 disposed on the one surface of the first insulating layer and including a metal pattern 511; a second insulating layer 600 disposed on the one surface of the first insulating layer, covering the first wiring layer, and including a second opening C2 having a diameter, larger than a diameter of the first opening C1, and exposing the metal pattern 511; a second wiring layer 610 disposed on the other surface of the first insulating layer 500 and including a pad 610P; and a third insulating layer 700 disposed on the other surface of the first insulating layer 500 and covering the second wiring layer 610.

In this case, the first opening C1 may extend into the third insulating layer 700, and may expose the pad 610P of the second wiring layer 610.

In this case, the second wiring layer 610 may be partially or completely buried in the third insulating layer 700, and an upper surface of the pad 610P of the second wiring layer 610 may be coplanar with a lower surface of the first insulating layer 500.

In addition, the first wiring layer 510 may protrude from the first insulating layer 500, and a third wiring layer 710 may protrude from the third insulating layer 700, but are not limited thereto.

Also, the first opening C1 may extend to one surface of the third insulating layer 700 in which the pad 610P is formed, and the first opening C1 may not entirely extend through the third insulating layer 700, and may only partially extend through the third insulating layer 700.

In addition, the pad 610P of the second wiring layer 610 may be formed to be spaced apart from a sidewall of the first opening C1.

In addition, the printed circuit board 10E may further include a third wiring layer 710 disposed on one surface of the third insulating layer 700, a first via TV1 connecting the first and second wiring layers 510 and 610, and a second via TV2 connecting the second and third wiring layers 610 and 710.

In this case, the first and second vias TV1 and TV2 may have a tapered shape in a direction toward the second wiring layer 610. For example, each of the first and second vias TV1 and TV2 may be narrowed in the direction toward the second wiring layer 610.

In addition, the printed circuit board 10E may include a plurality of insulating layers and a plurality of wiring layers, and a solder resist layer R may be formed on an outermost insulating layer. In this case, the second opening C2 may be formed to extend to an uppermost insulating layer and the solder resist layer R formed in the uppermost insulating layer.

Also, an opening may be formed in the solder resist layer R to expose a portion of an outermost wiring layer externally.

In addition, the printed circuit board 10E may further include a plurality of vias connecting the plurality of wiring layers, and the plurality of vias may have a tapered shape toward the second wiring layer 610.

The plurality of insulating layers including the first to third insulating layers 500, 600, and 700 may include the same material or different materials. In addition, the first to third insulating layers 500, 600, and 700 may include a thermosetting resin.

A material for forming the plurality of insulating layers including the first to third insulating layers 500, 600, and 700 is not particularly limited. For example, known materials such as prepreg (PPG), Ajinomoto build-up film (ABF), polyimide, epoxy, a copper foil coating resin (RCC), a liquid crystal polymer (LCP), or the like may be used.

The plurality of wiring layers including the first to third wiring layers 510, 610, and 710 may be formed by a plating process. For example, the plurality of wiring layers may be formed by an additive process (AP), a semi-additive process (SAP), or a modified semi-additive process (MSAP). As another example, the plurality of wiring layers may be formed by a subtractive process such as tenting, or the like.

In addition, a conductive material may be used as a material for forming the plurality of wiring layers including the first to third wiring layers 510, 610, and 710. For example, a conductive material such as copper (Cu), aluminum (Al), silver (Ag), gold (Au), nickel (Ni), lead (Pb), titanium (Ti), tin (Sn), palladium (Pd), alloys thereof, or the like may be used.

In addition, the solder resist layer R may be made of a photosensitive material. In addition, the solder resist layer R may have thermosetting and/or photocuring properties.

In addition, the first and second vias TV1 and TV2 may be completely filled with a metal material, or the metal material may be formed along a wall surface of the via hole. The first and second vias TV1 and TV2 may be formed by a plating process, for example, AP, SAP, MSAP, TT, or the like. As a result, the first and second vias TV1 and TV2 may include a seed layer that may be an electroless plating layer and an electrolytic plating layer formed based on the seed layer. As necessary, a primer copper foil may be further included, but is not limited thereto.

The metal pattern 511 of the first wiring layer 510 may be a mask pattern. The mask pattern may function as a guide pattern, and the metal pattern 511 may be formed to improve positional accuracy and a size thereof in a process of forming the first or second openings C1 and C2.

In addition, the metal pattern 511 of the first wiring layer 510 may include copper (Cu), and may include a metal having lower workability than the first to third insulating layers 500, 600, and 700, but not limited thereto.

In addition, only a single insulating layer may be formed between the metal pattern 511 of the first wiring layer 510 and the pad 610P of the second wiring layer 610.

In this case, the single insulating layer may be the first insulating layer 500, and the first and second wiring layers 510 and 610 may be formed to have patterns protruding from one surface and the other surface of the first insulating layer 500, respectively.

Each of the first and second openings C1 and C2 may have one sidewall and the other sidewall facing the one sidewall in one direction, and the one sidewall and the other sidewall of the first opening C1 may be spaced apart from the one sidewall and the other sidewall of the second opening C2, respectively.

Also, metal patterns 511 of the first wiring layer 510 may be exposed through the one sidewall and the other sidewall of the second opening C2, respectively.

For example, the first insulating layer 500 and the second insulating layer 600 may form a step difference, and the metal patterns 511 of the first wiring layer 510 may be exposed in a region in which the step difference is formed.

Lengths of the metal patterns 511 exposed through one sidewall and the other sidewall of the second opening may be different or the same in the one direction.

A length of each of the exposed metal pattern 511 in the one direction may correspond to an average value of measured values, and the average value may correspond to an arithmetic average value, but is not limited thereto.

The measured values may correspond to values of the exposed surfaces of the metal patterns 511, measured a plurality of times, in the one direction, but is not limited thereto.

The metal pattern 511 of the first wiring layer 510 may be extended to surround the first opening C1 or the second opening C2, and a shape thereof may be formed in a circle, an ellipse, or a polygon, but is not limited thereto.

In addition, a plurality of metal patterns 511 of the second wiring layer 610 may be formed to surround a side surface of the second opening C2. For example, a substrate 10 may include four surfaces, and metal patterns 511 of the second wiring layer 610 may be respectively disposed on the four surfaces of the substrate 10 among the side surfaces of the second opening C2, but are not limited thereto.

In this case, the metal patterns 511 may be exposed through entire sidewalls of the second opening C2, or may be exposed only through one sidewall of the second opening C2. For example, an entire surface of each of the metal patterns 511 may be exposed through the second opening C2, and only a portion of one surface of each of the metal patterns 511 may be exposed through the second opening C2.

Since other descriptions may be applied in substantially the same manner as those described above, detailed descriptions thereof will be omitted.

Figure 9:
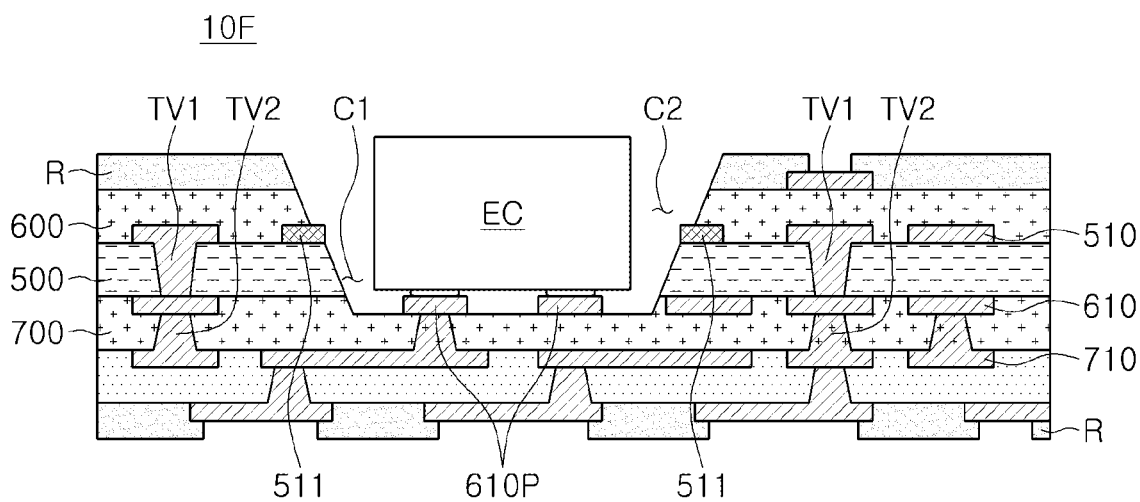
FIG. 9 is a view schematically illustrating an example in which an electronic component is mounted on a printed circuit board according to another embodiment of the present disclosure.

FIG. 9 is a view schematically illustrating an example in which an electronic component is mounted on a printed circuit board according to another embodiment of the present disclosure.

Referring to the drawing, in a printed circuit board 10F, an electronic component EC may be disposed in a first opening C1, and may be connected to an exposed pad 610P of a second wiring layer 610.

The electronic component EC may be connected to the pad 610P through a connection conductor. The connecting conductor may be a solder ball, but is not limited thereto, and a conductive material may be used without limitation.

In addition, the electronic component EC may be an active component, specifically, a plurality of dies. The plurality of dies may be connected to each other to implement an application processor. The electronic component EC is not limited thereto, and may be a passive component such as a capacitor, an inductor, or the like.

Since other descriptions may be applied in substantially the same manner as those described above, detailed descriptions thereof will be omitted.

An expression stating "one component is disposed on the other component" in the present specification may not be intended to establish a direction. Accordingly, the expression stating "one component is disposed on the other component" may refer that the one component may be disposed on an upper side of the other component or may be disposed on a lower side of the other component.

In the present specification, terms such as upper surface, a lower surface, an upper side, a lower side, an uppermost side, a lowermost side, or the like may refer to a direction to be set based on the drawings for convenience of description. Therefore, depending on a direction to be set, the upper surface, the lower surface, the upper side, the lower side, the uppermost side, the lowermost side, or the like may be described as different terms.

As used herein, the term "connect" or "connection" in the present specification may not be only a direct connection, but also a concept including an indirect connection. In addition, the term "electrically connected" or "electrical connection" in the present specification is a concept including both a physical connection and a physical non-connection.

In the present specification, the expressions of "first," second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression "example" used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

A printed circuit board and a manufacturing process of the printed circuit board according to the present disclosure are not limited thereto, and modifications and variations could be made without departing from the spirit and scope of the present disclosure by those skilled in the art.

As one effect among various effects of the present disclosure, a printed circuit board including a microcircuit and/or a micro via may be provided.

As another effect among various effects of the present disclosure, a printed circuit board having improved uniformity of a microcircuit may be provided.

As another effect among various effects of the present disclosure, a printed circuit board having improved positional accuracy and a cavity size during processing of the cavity may be provided.

While example embodiments have been illustrated and described above, it will be apparent to those skilled in the art that modifications and variations could be made without departing from the scope of the present disclosure as defined by the appended claims.

What is claimed is:

1. A printed circuit board comprising:
a first insulating layer;
a first wiring layer disposed on one surface of the first insulating layer and including a pad;
a second insulating layer disposed on the one surface of the first insulating layer and covering the first wiring layer;
a second wiring layer disposed on one surface of the second insulating layer and including a metal pattern;
a third insulating layer disposed on the one surface of the second insulating layer and covering the second wiring layer; and
a cavity extending through each of the second and third insulating layers, and having a bottom surface and a sidewall respectively exposing the pad of the first wiring layer and the metal pattern of the second wiring layer,
wherein the cavity includes a non-through groove in the first insulating layer such that the non-through groove has a side surface defining an obtuse angle with the bottom surface.

2. The printed circuit board of claim 1, wherein the metal pattern is a mask pattern and comprises copper (Cu).

3. The printed circuit board of claim 1, wherein the metal pattern of the second wiring layer is provided as a first metal pattern and a second metal pattern, and
wherein the first metal pattern is exposed through one sidewall of the cavity and the second metal pattern is exposed through another sidewall of the cavity facing the one sidewall in one direction.

4. The printed circuit board of claim 3, wherein lengths of the first and second metal patterns respectively exposed through the one sidewall and the another sidewall of the cavity in the one direction are different.

5. The printed circuit board of claim 1, wherein the metal pattern of the second wiring layer extends to surround the cavity.

6. The printed circuit board of claim 1, wherein the metal pattern of the second wiring layer is provided as a plurality of metal patterns, and
wherein the cavity exposes the plurality of metal patterns.

7. The printed circuit board of claim 1, further comprising an electronic component disposed in the cavity and connected to the exposed pad of the first wiring layer.

8. The printed circuit board of claim 1, further comprising:
a third wiring layer disposed on one surface of the third insulating layer;
a fourth insulating layer disposed on the one surface of the third insulating layer and covering the third wiring layer;
a fourth wiring layer disposed on one surface of the fourth insulating layer; and
a via connecting adjacent two wiring layers of the first to fourth wiring layers,
wherein the via has a tapered shape in a direction towards the first wiring layer, and
the cavity further extends through the fourth insulating layer.

9. The printed circuit board of claim 8, further comprising a solder resist layer disposed on the one surface of the fourth insulating layer,
wherein the cavity extends through the solder resist.

10. A printed circuit board comprising:
a first insulating layer having one surface and another surface opposing the one surface, and including a first opening;
a first wiring layer disposed on the one surface of the first insulating layer and including a metal pattern;
a second insulating layer disposed on the one surface of the first insulating layer, covering the first wiring layer, and including a second opening having a diameter larger than a diameter of the first opening, and exposing the metal pattern such that a side surface of the second opening defines an acute outer angle with an upper surface of the metal pattern;
a second wiring layer disposed on the another surface of the first insulating layer and including a pad; and
a third insulating layer disposed on the another surface of the first insulating layer and covering the second wiring layer,
wherein the first opening extends into the third insulating layer to expose the pad of the second wiring layer, and
the pad of the second wiring layer is spaced apart from a sidewall of the first opening.

11. The printed circuit board of claim 10, wherein the metal pattern of the first wiring layer is a mask pattern and comprises copper (Cu).

12. The printed circuit board of claim 10, wherein each of the first and second openings has one sidewall and another sidewall facing the one sidewall in one direction,
wherein the one sidewall and the another sidewall of the first opening are spaced apart from the one sidewall and the another sidewall of the second opening, respectively.

13. The printed circuit board of claim 12, wherein the metal pattern is provided as a first metal pattern and a second metal pattern,
wherein the first metal pattern is exposed through the one sidewall of the second opening and the second metal pattern is exposed through the another sidewall of the second opening,
wherein lengths of the first and second metal patterns respectively exposed through the one sidewall and the another sidewall of the second opening in the one direction are different.

14. The printed circuit board of claim 10, further comprising:
a third wiring layer disposed on one surface of the third insulating layer;
a first via connecting the first and second wiring layers; and
a second via connecting the second and third wiring layers,
wherein the first and second vias have a tapered shape in a direction toward the second wiring layer.

15. The printed circuit board of claim 10, further comprising an electronic component connected to the exposed pad of the second wiring layer.

16. A printed circuit board comprising:
a plurality of insulating layers;
a second wiring layer including a metal pattern having a portion disposed between two of the plurality of insulating layers;
a cavity extending through at least the two of the plurality of insulating layers; and
a first wiring layer disposed in a first insulating layer of the plurality of insulating layers, and including a pad disposed in the cavity,
wherein one surface of the metal pattern defines a portion of a sidewall of the cavity,
the cavity extends into a portion of the first insulating layer, and
the metal pattern extends to surround the cavity.

17. The printed circuit board of claim 16, wherein the metal pattern of the second wiring layer is provided as a first metal pattern and a second metal pattern disposed on opposing sidewalls of the cavity.

18. The printed circuit board of claim 17, wherein a length of a portion of the first metal pattern extending in the cavity is greater than a portion of the second metal pattern extending in the cavity.

19. The printed circuit board of claim 17, wherein the first metal pattern includes a portion extending in the cavity, and the second metal pattern includes a side surface flushed with a side surface of one of the two insulating layers.

20. The printed circuit board of claim 16, wherein the metal pattern is spaced apart from a signal pattern of the printed circuit board.

21. The printed circuit board of claim 16, wherein the metal pattern is spaced apart from a signal pattern and a ground pattern of the printed circuit board.

* * * * *